United States Patent [19]

Elwell et al.

[11] Patent Number: 5,412,539
[45] Date of Patent: May 2, 1995

[54] MULTICHIP MODULE WITH A MANDREL-PRODUCED INTERCONNECTING DECAL

[75] Inventors: Dennis F. Elwell, San Clemente; William R. Crumly, Anaheim; Harold C. Bowers, Rancho Palos Verdes, all of Calif.

[73] Assignee: Hughes Aircraft Company, Los Angeles, Calif.

[21] Appl. No.: 136,844

[22] Filed: Oct. 18, 1993

[51] Int. Cl.6 ............................................. H05K 1/11
[52] U.S. Cl. .................................... 361/792; 361/767; 361/790; 361/808; 174/255
[58] Field of Search ............... 361/767, 784, 792, 748, 361/760, 761, 774, 790, 808, 803, 807, 810; 174/52.1, 52.4, 255; 257/686, 700

[56] References Cited

U.S. PATENT DOCUMENTS 5,245,135  9/1993  Schreiber et al. .................. 174/261
5,280,413  1/1994  Pai ....................................... 361/792

*Primary Examiner*—Leo P. Picard
*Assistant Examiner*—Young Whang
*Attorney, Agent, or Firm*—Elizabeth E. Leitereg; Terje Gudmestad; W. K. Denson-Low

[57] ABSTRACT

An inexpensive arrangement for mounting multiple, closely spaced integrated circuit chips (18, 20, 22, 24) on a low temperature co-fired ceramic (LTCC) substrate (10) uses a mandrel-produced thin film decal (26) having patterns of interconnecting conductive traces (34, 46, 47) that connect to the fine pitch connecting pads (60) of the integrated circuit chips at one end and connect to the relatively coarse pitch connecting pads (50) of the low temperature co-fired ceramic substrate at the other end. The interconnect decal is formed independently of the LTCC substrate and is provided with chip connections at a pitch of about 0.004 inches. The interconnect pads of the decal are connected by conductive traces on the decal to the LTCC pads which have a pitch in the order of about 0.01 inches or greater. The decal, which is formed independently of the LTCC substrate, is connected to the substrate pads by one of several different electrically conductive adhesives, including silver loaded epoxy, Z-axis conductive epoxy and anisotropically and isotropically conductive epoxy or low melting temperature solder. The decal enables use of a "fan-out" arrangement in which connections are routed under the chip.

23 Claims, 5 Drawing Sheets

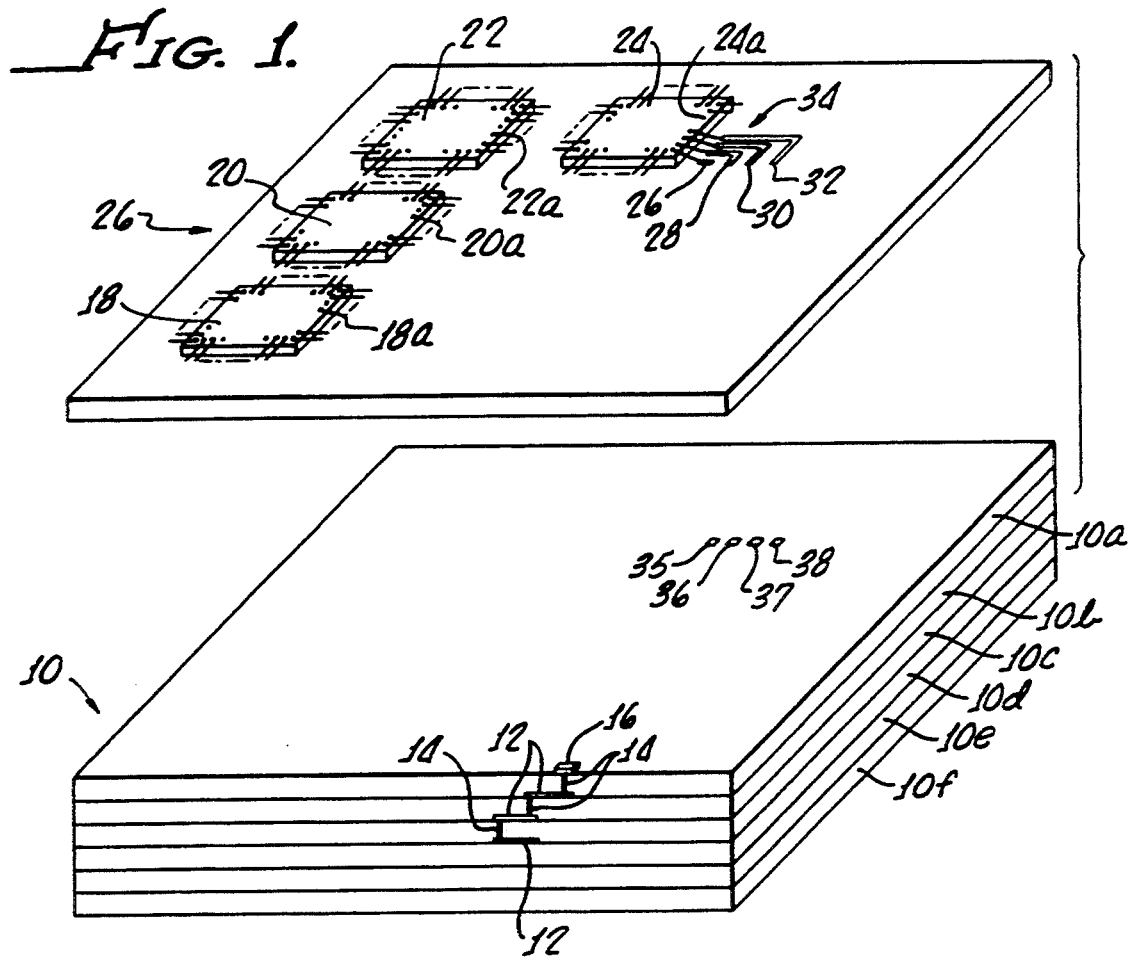

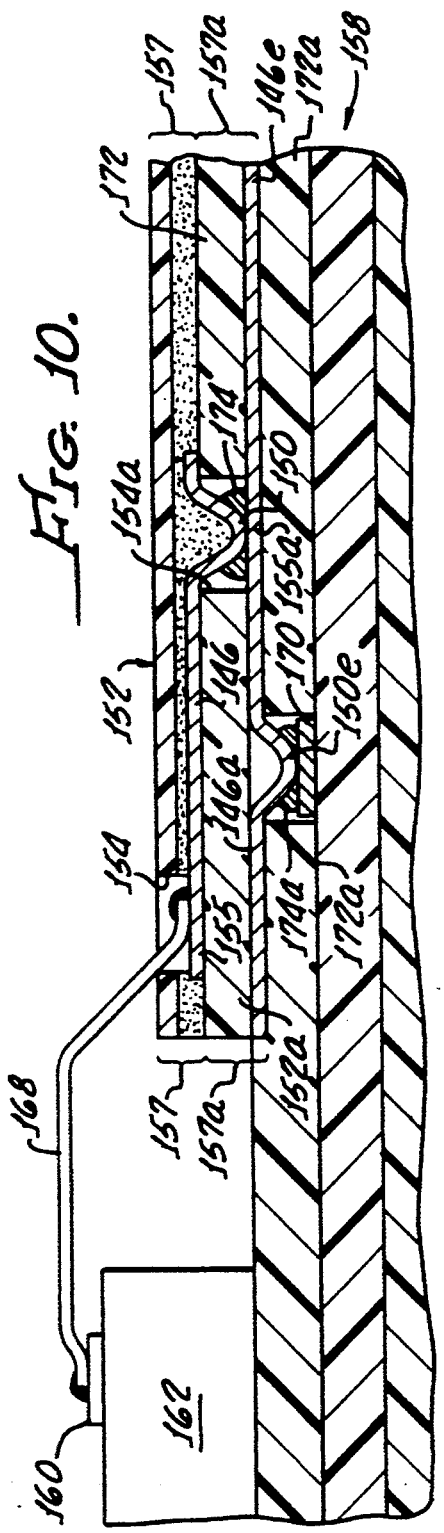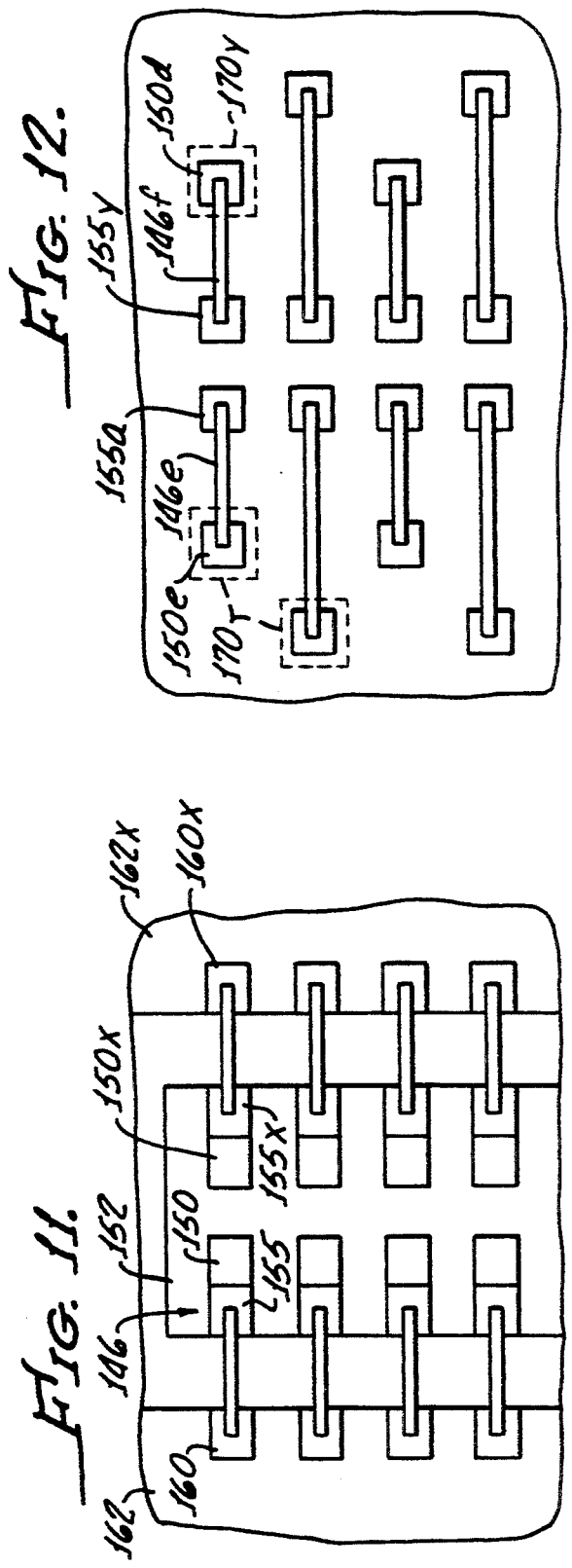

MULTICHIP MODULE WITH A MANDREL-PRODUCED INTERCONNECTING DECAL

BACKGROUND OF THE INVENTION

1. Field of the Invention

The present invention relates to multichip integrated circuit module assemblies and more particularly relates to an improved arrangement for coupling fine pitch pads of integrated circuit chips to coarse pitch pads of an interconnection substrate.

2. Description of the Prior Art

Many types of electronic devices employ a number of integrated circuit chips which are interconnected to one another and assembled in a single package or module. These multichip modules may employ state of the art semiconductor devices that are typically 0.5×0.5 inches in size with peripherally positioned input output contacts having a 0.004 inch pitch (e.g. center to center spacing). This pitch requires use of connecting lines and spaces between lines of 0.002 inches. Most commonly these multichip modules are mounted on multilayer polyimide dielectric substrates that employ thin film processes for forming electrically conductive traces to interconnect with the various chip contacts. The multilayer dielectric substrates are made employing techniques that have been initially developed for various types of semiconductor processing. They can be made with fine pitch traces but are time consuming and expensive to fabricate.

A different, less costly technology, termed Low Temperature Co-fired Ceramic (LTCC), has been developed for forming multilayer interconnecting circuits for multilayer electronic packages. LTCC technology employs multiple layers of ceramic tape processed by thick film techniques to provide conductive circuit traces and interconnections extending between the many layers of the LTCC module. The LTCC module is capable of high volume low cost manufacturing but is subject to the limitation of relatively coarse pitch interconnecting traces and vias. In the LTCC process, metalization is applied using thick film technology which limits the pitch of conductors and connecting elements to approximately 0.016 inches. Attempts to provide LTCC modules with a much finer pitch greatly degrades the manufacturing yield. In general, the requirement of a coarse pitch is not a major handicap for LTCC processing since a large number of layers of this multilayer substrate can be employed. However, fine pitch lines or connections cannot be formed in the LTCC module, and thus, an integrated circuit chip having a set of fine pitch peripheral contacts cannot be mounted on or otherwise accommodated on the top layer of the multilayer LTCC module. Arrangements for directly connecting the peripheral contact pads of the integrated circuit chip to the more widely spaced pads of the LTCC module require excessive amounts of area of the module and thus prevent spacing of several integrated circuit chips close to one another on the surface of the module.

Attempts have been made in the past to form thin film type interconnect circuits directly on the surface of the LTCC module to which the integrated circuit chips are mounted. The application of semiconductor processing techniques directly to the LTCC module requires difficult, time consuming and expensive procedures. Generally, testing of such circuits can be achieved only after the entire package has been assembled, resulting in greater costs and more failures because inadequacies of subassemblies cannot be detected at an earlier stage.

The combination of thin film technology with a ceramic substrate for packaging applications might be perceived as a simple extension of semiconductor technology to cruder dimensions. In practice, there are critical challenges in combining glass ceramic (LTCC) and thin film technology. These include the matching of a photolithographic pattern to a distorted sintered ceramic pattern, the surface roughness and non-homogeneity of the ceramic surface, the requirement for defect free wiring over the entire area of the substrate, the relatively high current carried which requires much thicker conductors, and finally, multiple metallurgies are required for various interconnection functions.

Accordingly it is an object of the present invention to provide a multichip module in which above-mentioned problems are avoided or minimized.

SUMMARY OF THE INVENTION

In carrying out principles of the invention in accordance with a preferred embodiment thereof, a multichip integrated circuit assembly is made by forming a low temperature co-fired ceramic multilayer substrate having a plurality of LTCC pads, forming an interconnect decal having a pattern of conductive traces, each connected to a primary interconnect decal pad and a secondary interconnect decal pad, providing a plurality of integrated circuit chips each having a plurality of chip pads, connecting the chip pads to selected ones of the primary decal pads, connecting the secondary decal pads to the LTCC pads and mounting the chips and decal on the substrate. Alternatively, the decal may be first connected to the LTCC and the chips then connected to the decal. According to one feature of a preferred embodiment of the invention, the decal is made independently of the substrate, preferably by being separately additively formed on a mandrel. One or more layers of the interconnecting decal may be employed to enhance density of coverage of the LTCC module surface with semiconductor chips. A significant benefit is obtained from a "fan-in" arrangement in which connections from the chip to the decal are routed under the chip.

BRIEF DESCRIPTION OF THE DRAWINGS

FIG. 1 is a pictorial exploded illustration, with parts broken away, showing a module employing an interconnecting decal between a group of integrated circuit chips and an LTCC module.

FIGS. 2 through 6 illustrate certain steps in the use of a mandrel for manufacturing the decal of FIG. 1.

FIG. 10 is a fragmentary sectional view similar to FIG. 7 showing two decal layers interconnecting a chip with an LTCC module.

FIG. 11 is a fragmentary plan view illustrating connections of the chips to the upper decal layer of FIG. 10.

FIG. 12 is a fragmentary plan view of a pattern of connections on the lower layer of decal of FIG. 10.

DESCRIPTION OF THE PREFERRED EMBODIMENTS

Figure 7:
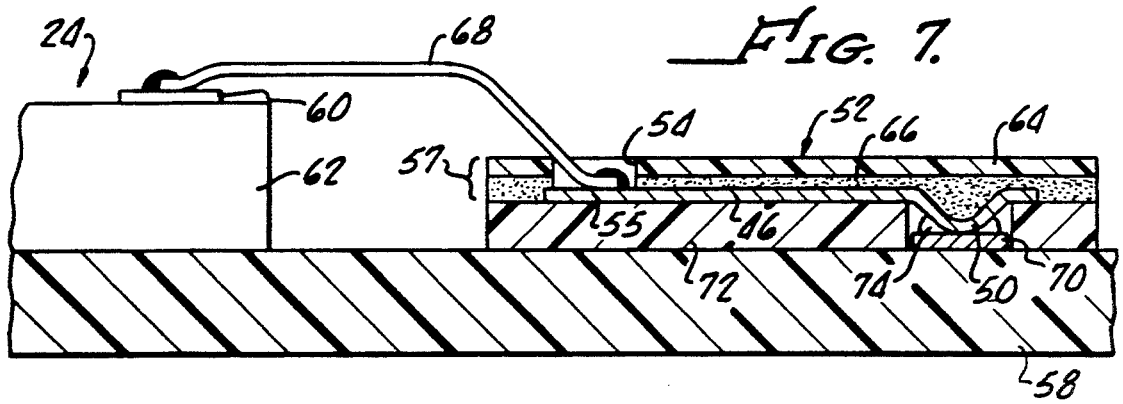
FIG. 7 is a fragmentary sectional view showing portions of a chip and an LTCC module interconnected by a decal embodying principles of the present invention.

The multichip module is an assembly of high density integrated circuit chips interconnected to one another or to other modules or other external circuits. Generally, according to an exemplary embodiment of the present invention, an inexpensive multilayer low temperature co-fired ceramic module provides circuits that connect one chip to another. By forming the chip interconnecting circuits on several LTCC layers the chips may be positioned close to each other to provide the highly desired high density packaging of multiple chips. According to disclosed embodiments of the present invention, one or more layers of independently formed decals electrically connect the fine pitch chip pads to the coarse pitch LTCC pads.

Illustrated schematically in FIG. 1 is part of a multilayer low temperature co-fired ceramic interconnection module (LTCC) 10, having layers 10a–10f showing portions of connecting circuit traces 12 interconnected by vias 14, and having a surface mounted connecting pad 16. It will be understood that these elements within the multilayer LTCC module are merely simplified representations of the interconnected layers of circuitry, vias and pads formed throughout the module. A plurality of integrated circuit chips 18, 20, 22 and 24, each having a plurality of peripherally disposed contact pads, generally indicated at 18a, 20a, 22a and 24a, are mounted on a thin flexible decal 26 for connection to pads on the upper surface of top layer 10a of the LTCC module 10. The decal is fixedly mounted on the upper surface of the LTCC module as by adhesive, as will be more particularly described below, and includes a number of decal pads illustrated at 26, 28 30 and 32 which are connected by wire bonds generally indicated at 34 (for chip 24) to respective ones of four of the peripheral contact pads 24a of the integrated circuit chip 24. It will be readily understood that although four of the decal pads 26 through 32 are shown in detail, in actual practice, the decal has one such pad for each of the peripheral contact pads of each of the integrated circuit chips mounted thereon. Each of the decal pads 26–32, which may be termed primary interconnecting decal pads, is connected by a circuit trace (not shown in FIG. 1) formed in the decal to a respective one of a plurality of electrical contact bumps or projecting features (secondary interconnecting decal pads) (not shown in FIG. 1) which project from the lower surface of the decal into contact with a respective one of LTCC pads 35, 36, 37 and 38 formed on the upper surface of the upper layer 10a of the LTCC module. Thus, there is a conductive path from the chip pads through the connecting wires 34, primary decal pads 26 through 32, through the decal circuit traces and secondary interconnecting decal pads (bumps) to the LTCC pads 35 through 38 by means of circuitry and vias on the surface of or within various layers of the LTCC module. This conductive path is shown in section in FIG. 7 as pad 60 of chip 62, connecting wire 68, primary decal pad 55, decal circuit trace 46, secondary decal pad (bump) 50 and LTCC pad 70.

Decal 26 is a thin flexible multilayer sheet of a substrate such as an adhesive clad dielectric (Kapton or other polyimide) carrying a pattern of electrically conductive circuit traces having primary and secondary interconnecting decal conductive pads formed thereon. Actually the primary decal pad (FIG. 7) in one embodiment is formed by an end 55 of a decal circuit trace 46 and accessible through a hole 54 in the dielectric substrate 14 of the decal, whereas the secondary interconnecting decal pad 50 is formed as a projecting feature or bump extending from the opposite surface of the decal. Generally the decal will cover the entire surface of the LTCC substrate, although, as shown in FIG. 7, a "window" or opening may be provided for one or more chips for improved heat transfer.

In one example of a method for manufacture of the decal, a mandrel 40 (FIG. 2), which may be a sheet of an electrically conductive material such as stainless steel for example, is formed with a depression 44 and then coated with a thin release coating 42 (FIG. 3) of copper. The release layer of copper then has deposited thereon a pattern of a electrically nonconductive photoresist material 45 (FIG. 4) and the entire assembly of mandrel resist and copper release layer is then placed in an electrolytic bath for electroplating an electrically conductive trace 46, which may be formed of copper for example. Trace 46 has a first end 55 which will form a primary interconnecting decal pad of the trace 46 and a projecting feature or bump 50 which will form a secondary interconnecting decal pad of the connecting trace 46 (FIG. 5). Thereafter a dielectric core in the form of an adhesive clad dielectric such as a Kapton polyimide 52, predrilled with one or more holes 54, is laminated to the electrically deposited traces 46. Holes 54 are positioned to register with end portions of the interconnecting conductive trace 46. If deemed necessary or desirable, the interior of the projecting feature or bump 50 may be filled with an epoxy 56 prior to the application of the dielectric core 52 in order to stabilize and strengthen the bump. The mandrel is then removed from the decal, and the release coating of copper is then removed by a suitable etching bath. The finished decal appears as in FIG. 6 (showing only a small section of the decal). Thus the decal comprises a thin flexible dielectric sheet bearing a pattern of many conductive traces such as trace 46, each of which has a primary decal pad at one end thereof (in this case formed by the end of trace 46 that is exposed in the substrate hole 54) and a secondary decal pad formed by the projecting feature defined by bump 50. It will be understood that the decal, which has a total thickness not including the bump of about 2.0 mils is formed with a pattern of a number of electrically conductive traces 46 each having an interconnection pad at its opposite ends. The described additive electroplating process is but one of many known thin film lithographic processes by which the decal may be made.

FIG. 7 illustrates a section of portions of the decal shown in FIG. 6 mounted on an LTCC module and configured and arranged to interconnect a pad 60 on a chip 62 to LTCC module 58. The decal substrate 52 includes a layer of Kapton polyimide 64 and a layer of adhesive 66 secured to the conductive trace 46. Connecting wire 68 is bonded to the chip pad 60 at one end and at the other end to the primary decal connecting pad 55 formed by the portion of conductor 46 that is exposed through substrate hole 54. The projecting feature or bump 50 of the decal which forms the secondary decal pad is positioned directly upon an LTCC connecting pad 70 formed on the upper surface of the LTCC module 58. The decal may be secured to the upper surface of the LTCC by an electrically nonconductive epoxy adhesive 72. An electrically conductive adhesive 74 electrically and mechanically interconnects and secures the decal bump 50 with the LTCC pad 70. An alternative assembly sequence is to secure the decal to the LTCC substrate first, and then attach the chips to the decal.

Figure 8:
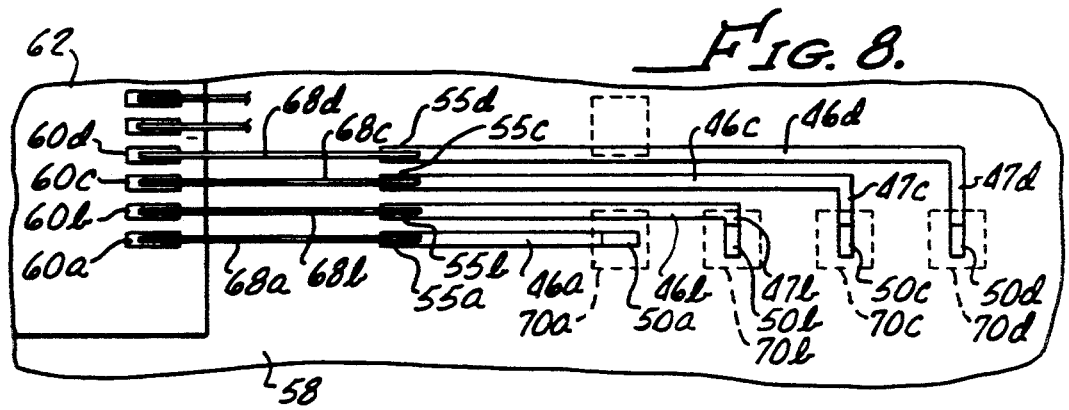
FIG. 8 is a fragmentary plan view of the upper surface of the assembly of FIG. 7, illustrating certain patterns of electrical conductor routing.

FIG. 8 is a plan view of a small portion of the upper surface of the LTCC module 58 on which is mounted the chip 62 with chip pads 60a, 60b, 60c and 60d are shown, although it will be readily understood that the chip has more connecting pads positioned around its periphery. Chip pad 60a is connected by a bonded wire 68 to an end 55a of trace 46a at the other end of which is formed the projecting feature or depression 50a. The adhesive clad polyimide Kapton substrate of the decal is not shown in FIG. 8 for clarity of the drawings.

Additional chip pads 60b, 60c and 60d are connected by wires 68b, 68c, 68d to primary decal pads 55b, 55c, 55d of decal conductive traces 46b, 46c and 46d which extend in the illustrated L-shaped configuration and have right angle end portions 47b, 47c and 47d respectively terminating in secondary decal pads or bumps 50b, 50c and 50d. These bumps are positioned over and electrically connected to additional LTCC module surface mounted pads 70b, 70c and 70d, respectively.

The chip pads are close together, with these pads having a pitch of about 0.04 inches. The conductive traces 46 may have the same fine pitch as the chip pads. However, the LTCC pads 70 may be 0.008 inches on a side and spaced apart by 0.008 inches. Accordingly, the pattern of conductive traces 46 on the decal is provided with a suitable configuration such as the exemplary configuration illustrated in FIG. 8 that positions all of the secondary decal pads 50 of the decal conductors at positions registered with the coarse-pitch LTCC pads. In this manner, with a simple, inexpensive, independently formed flexible decal, the fine-pitch chip pads are readily connected electrically to the coarse pitch LTCC pads.

Figure 9:
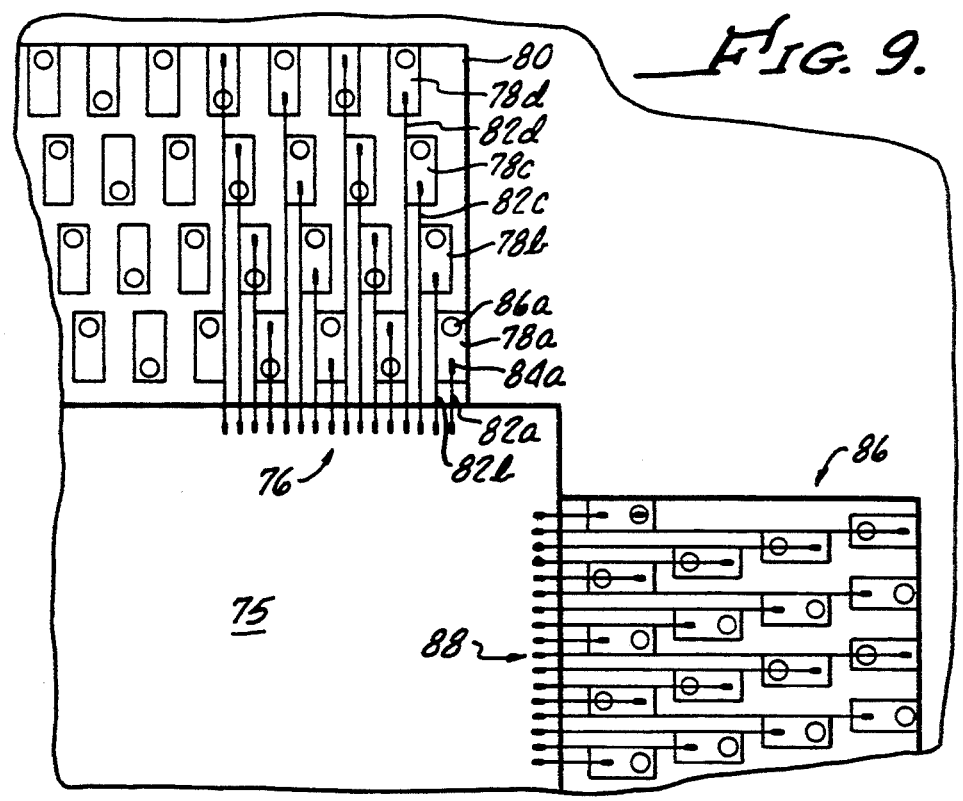
FIG. 9 is a plan view of a part of a chip and decal illustrating alternate patterns of electrically conductive trace routing.

Illustrated in FIG. 9 is one of many alternative arrangement of horizontal patterning of the decal conductive traces and primary and secondary decal pads. Thus, as shown in FIG. 9 an integrated circuit chip 75 is formed with a plurality of peripherally arranged contact pads, some of which are generally indicated at 76 and which are connected individually to conductive traces such as traces 78a, 78b, 78c and 78d on a decal 80. A first wire bonded (e.g. ball bonded, wedge bonded, or the like) wire 82a is connected from a first chip pad to a primary decal pad 84a of decal trace 78a. The decal trace 78a includes a bump or projecting feature 86a on its lower surface corresponding to bump 50 of the conductor 46 of FIG. 7. The decal pads and conductive traces have the configuration, in elevation, illustrated in FIG. 7. Similarly additional wires 82b, 82c and 82d are connected to primary pads on decal conductors 78b, 78c and 78d, each of which also is provided with a projecting feature or bump on its lower surface as described in connection with the conductor 78a. Each of the projecting features or bumps on conductors 78 is in electrical contact with an LTCC pad on the upper surface of the LTCC module on which the chip and decal are mounted. FIG. 9 also illustrates a second decal 86 connected to a second group of peripheral chip pads 88 by an arrangement of a decal projectors and primary and secondary decal pads and ball bonded wires in the manner described above. Decals 80 and 86 may be integral parts of a single unitary decal that covers the entire LTCC substrate.

The arrangements illustrated in FIGS. 7, 8, and 9 provide a simple, inexpensive and effective connection of fine-pitch circuit chip pads to coarse-pitch LTCC module pads. The chip pads and connecting wires are closely spaced and connected to LTCC pads which are less closely spaced. Moreover, the interconnection is accomplished by a simple and relatively inexpensive decal that is made independently of the LTCC module. However, in both the arrangement of FIG. 8 and that of FIG. 9, a relatively large module surface area is used for the connections between the integrated circuit chip pads and the decal primary and secondary connecting pads. This prevents chips from being mounted on the surface of the LTCC module as close to one another as would otherwise be desirable.

An alternative arrangement of interconnecting decals that minimizes use of surface area is shown in FIG. 10, which illustrates use of two layers of decals. Use of multiple layers of decals enables connections to be made in a manner that requires less surface area of the LTCC module, thereby allowing chips to be positioned closer to each other. In the arrangement of FIG. 10 parts corresponding to similar parts of FIGS. 7-9 are designated by similar reference numerals with a prefix 1 employed to designate elements of FIG. 10. A low temperature co-fired ceramic multilayer module 158 mounts a chip 162 having a pad 160 connected by a ball bonded wire 168 to a first decal layer 157 having an electrically conductive trace 146 and a primary decal pad 155 exposed through a hole 154 in the Kapton-/adhesive substrate 152 that carries the conductive trace 146. A projecting feature or connecting bump 150 formed at the other end of trace 146 is connected by means of a conductive adhesive such as a silver epoxy 174, for example, to a portion 155a of the conductive trace 146a of a second similar decal layer 157a including an adhesive clad Kapton substrate 152a (including layers of Kapton and adhesive) having a hole 154a. The first decal layer 157 is secured to the second decal layer 157a by an interposed nonconductive adhesive layer 172. The bump 150e of conductor 146a of the second decal layer projects downwardly from the decal for connection to a contact pad 170 on the upper surface of LTCC 158. Bump 150a of the second decal layer is positioned closer to the chip 162 than is bump 150 of the first decal layer, thereby conserving horizontal area. The second decal layer 157a is secured to the LTCC module by a layer of nonconductive adhesive 172a.

The arrangement allows connection of the chip to the decal using less surface area as illustrated in the plan views of FIGS. 11 and 12. FIG. 11 illustrates the connection of the chip 162 and its peripheral pads 160 to the first decal layer 157 and, more particularly, to its primary connecting pads 155. Decal pads 155 are connected by the decal conductive traces to decal bumps 150 which are positioned closely adjacent the primary connecting pad 155.

A similar adjacent chip 162x having a set of peripheral pads 160x is connected by ball bonded wires to primary contact pads 155x of the first layer decal, with the pad 155x being connected by decal conductors to a closely adjacent secondary decal pads 150x. The other pads on each chip are similarly connected. The bumps 150 and 150x of the first decal layer protrude downwardly as indicated in FIG. 10 for connection to primary connecting pads such as 155a and 155y shown in FIG. 12. Pad 155a in the second decal layer 157a is connected by a decal conductor 146e in the second layer to a downwardly projecting bump 150e of the second layer, which in turn is connected to the LTCC pad 170. Similarly, bump 150x of the first layer (FIG. 11) is connected to primary contact pad 155y of a conductor 146f of the second layer which in turn is connected to a secondary contact pad or bump 150d of the second layer. The latter is connected to a second pad 170y on the surface of the LTCC. Thus, connections from the chip to the first decal layer extend outwardly of the chip periphery as shown in FIG. 11 but only for a relatively short distance. The first decal layer then connects to the second decal layer which redirects the connecting lines inwardly back toward the chip to provide relatively large spaces between the secondary connecting pads, e.g. bumps, of the second layer which are connected to the relatively coarse-pitch pads of the LTCC. The several bumps of the second decal layer are staggered horizontally (FIG. 12). However, this staggering is in the second layer of the decal and thus does not utilize space on the upper surface of the assembly. In the arrangement of FIGS. 10, 11 and 12, chip density may be further enhanced by positioning the decal pads, such as bumps 150e and 150d (FIG. 12) of the second decal layer, directly beneath the chips, between the chip and LTCC module.

Figure 13:
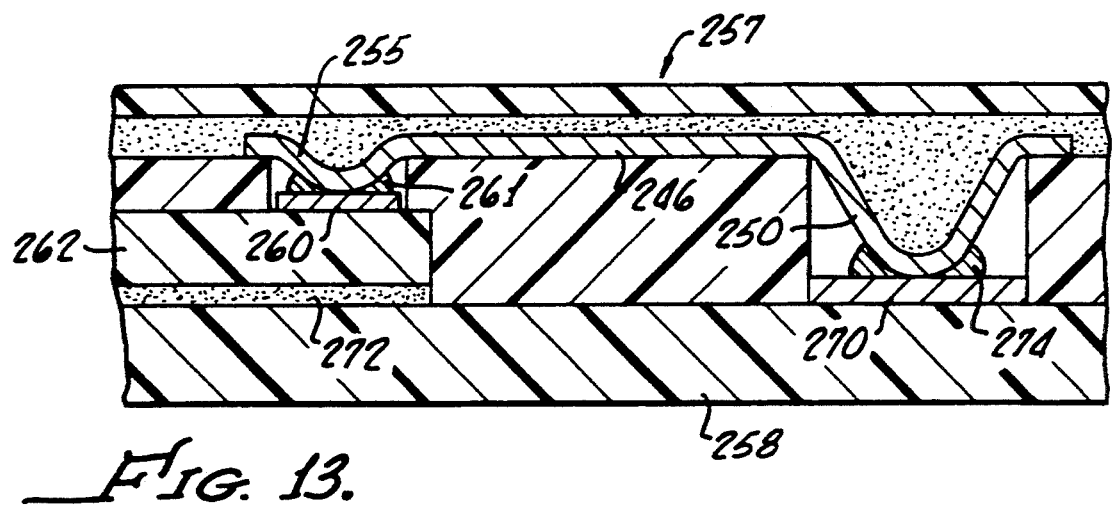
FIG. 13 illustrates an alternate arrangement for employing a flexible mandrel-formed decal for interconnection of a chip and LTCC module pad.

Illustrated in FIG. 13 is still another embodiment for interconnecting fine-pitch chip pads to coarse-pitch LTCC pads by an independently fabricated decal. In this embodiment elements corresponding to like elements of FIGS. 7 and 8 are designated by like reference numerals with the addition of a prefix 2. Thus, a chip 262 (corresponding to chip 62 of FIGS. 7 and 8) is mounted by an epoxy 272 to the upper surface of an LTCC module 258 having an LTCC pad 270. A flexible decal generally indicated at 257 includes an electrically conductive trace 246 having a primary conductive contact 255 which in this case takes the form of a bump of the type previously described. Bump 255 rests on a chip contact pad 260 and is secured thereto by an electrically conductive adhesive or solder 261. The decal conductor 246 includes a second downwardly projecting feature or bump 250 resting on an LTCC contact pad 270 and electrically and mechanically connected therewith by means of solder or an electrically conductive adhesive 274. In this arrangement, the decal is formed, as are all of the other decals described herein independently of the chip and independently of the LTCC. Preferably all decals are formed on the mandrel as described above. In the arrangement of FIG. 13 the pre-formed decal is first mounted to the chip which has been secured to the LTCC upper surface, and then the decal bumps 250 are connected to the LTCC pads.

Figure 14:
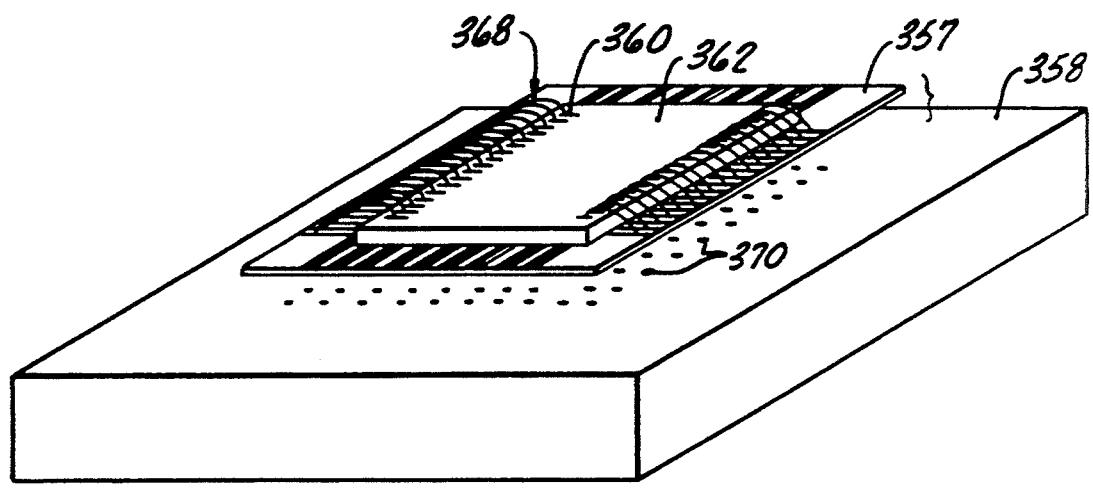
FIG. 14 is a pictorial illustration of a chip mounted to an LTCC by means of a "fan in" arrangement.
Figure 15:
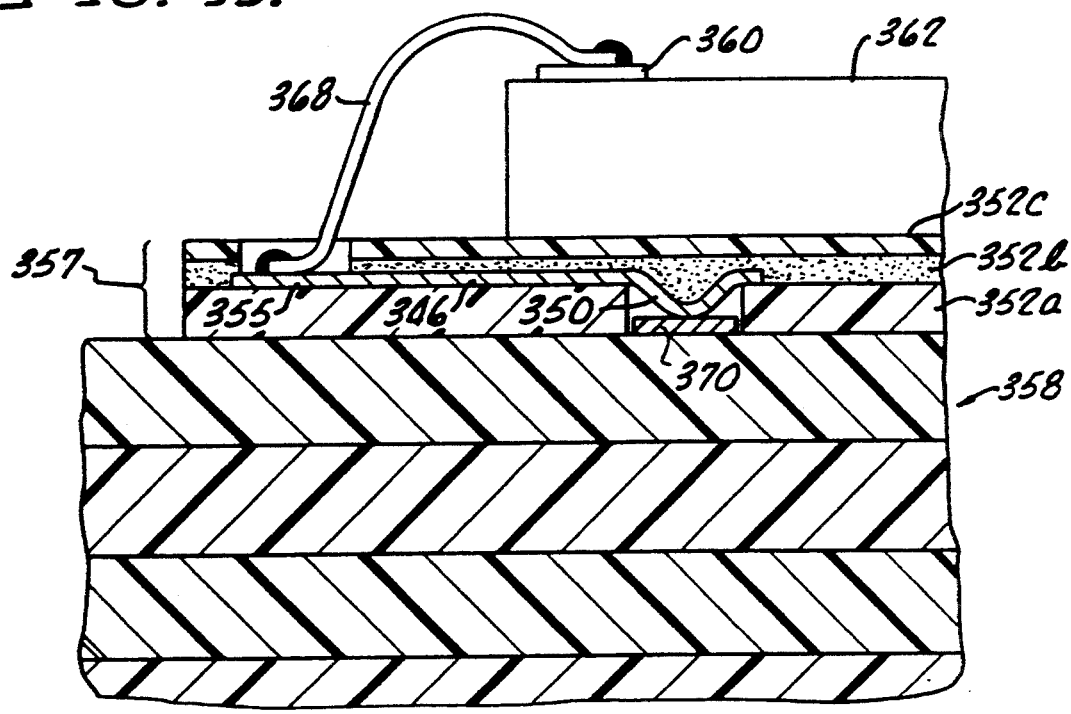
FIG. 15 is a partial sectional view of the arrangement of FIG. 14.

The arrangements of FIGS. 7 through 13 illustrate configurations that may be termed primarily types of "fan-out" arrangements in which connections are made from the chip to LTCC pads that are outside of the chip periphery. The types of fan-out shown in FIGS. 7 through 13 employ parallel lines, although the term "fan-out" is commonly used to denote lines that extend radially at different angles. Illustrated in FIGS. 14 and 15 is a chip-to-decal-to-LTCC module employing a "fan-in" arrangement wherein the contact pads along at least one side of a chip are connected to contact pads on the LTCC module that are within the perimeter of the chip and directly below the chip itself. This provides still further conservation of module surface and allows enhanced chip density. Thus, as illustrated in the exploded view of FIG. 14, a chip 362 has its set of peripheral chip pads 360 connected by wires 368 to a decal 357 that is mounted on the upper surface of an LTCC module 358 having surface pads 370 thereon. In the "fan-in" arrangement shown in FIGS. 14 and 15, each chip pad 360 is connected by a wire bonded lead 368 to a primary connecting pad 355 (FIG. 15) of the conductor 346 of the decal 357. Conductor 346 includes a secondary connecting decal pad in a form of a downwardly protruding bump 350 which is electrically connected to LTCC pad 370 at a point directly below the chip. The decal conductor 346 extends from the primary decal pad 355 inwardly toward and under the chip to its secondary decal pad or bump 350. In this arrangement, the decal 357 includes a layer of adhesive 352a, a layer of polyimide 352b and a second double-adhesive clad polyimide layer 352c interposed between the chip and the decal for securely physically connecting the chip to the decal. Adhesive layer 352a connects the decal to the surface of the LTCC.

Figure 16:
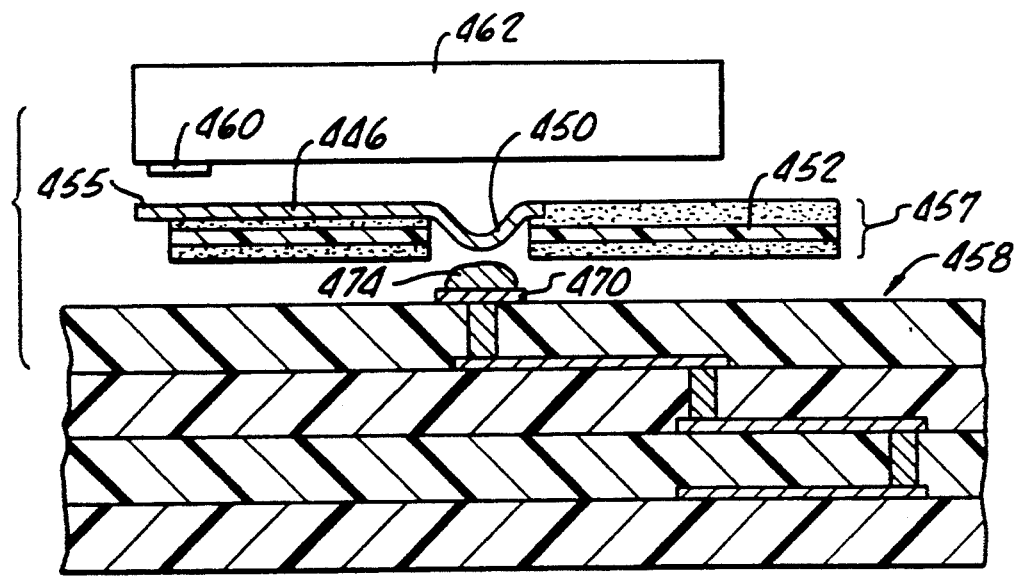
FIG. 16 is a partial sectional exploded view of a decal connected to provide a flip chip arrangement wherein contact bumps are provided on the chip within its periphery.

A chip mounting arrangement termed a "flip chip" employs a chip having peripheral contact pads each formed with a protruding bump thereon. This enables the chip to be placed upside down on a substrate with the chip pad bumps in contact with pads formed on the substrate to directly connect the bumps of the chip pads to the substrate. This arrangement is effective in utilizing decreased area for chip mounting but requires specially prepared and therefore more expensive chips. The decal arrangement described above, with some modification, may be employed to effectively form a chip capable of flip chip mounting without forming the chip bumps when the chip is manufactured. Thus a chip not specially prepared can be used as a "flip chip". Illustrated in the exploded view of FIG. 16 is a chip 462 having a series of peripheral chip contact pads 460. The chip is mounted to an LTCC substrate module 458 by means of a decal 457 including a conductive trace 446 having a primary decal contact 455 coupled with a secondary decal contact or bump 450. The decal substrate includes a double-adhesive clad Kapton layer 452 that secures the decal both to the chip and to the LTCC module. The decal is positioned as shown in FIG. 16 directly below the chip with its primary contact pad 455 in electrical contact with the chip pad 460 and with its secondary contact pad or bump 450 connected with the LTCC pad 470 by means of an electrically conductive adhesive 474. In this flip chip mounting arrangement, the interconnecting circuit module, shown in FIG. 16 as a multi-layer LTCC module 458, may be a substrate other than a thick film coarse-pitch device. Module 458, for example, may be a multilayered polyimide substrate formed by conventional thin film metalizing processes that enable provision of fine pitch connecting pads on the substrate.

In the several embodiments described above, the secondary decal connecting pads, e.g., the bumps 50, etc., may be connected to the LTCC module pads in any one of a number of different arrangements, all of which employ some type of epoxy adhesive. The predrilled film or decal substrate of Kapton, clad on both sides with an epoxy adhesive, may be used to attach the decal to the LTCC. The projecting bumps or secondary connecting decal pads project through the predrilled holes in the Kapton adhesive substrate to contact the pads of the LTCC. The bumps or secondary decal connecting pads may be connected to the LTCC pads in any one of a number of different arrangements. As described above and illustrated in the drawings, the bump may be coated with a silver-loaded epoxy forming an electrical connection during lamination. Alternatively, each bump may be replaced by a via in the decal which is filled with a silver-loaded epoxy to form contacts during the lamination of the decal to the substrate.

In still another arrangement, the contacting medium between the decal bump and the LTCC pad may be an electrically conductive z-axis conductive film, such as type 5303 made by 3M Company.

Anisotropically conductive epoxy such as Vriax TM made by Polycon may also be employed for electrically connecting the decal bumps to the LTCC pads. The Polycon material, for example, is a thin film containing a number of spaced conductive spheres. When the film is compressed, as between the decal bump and an LTCC pad, the electrically conductive spheres make contact through both sides of the film but do not contact one another. Still another mode of connecting the decal bumps to the LTCC is the use of a low melting temperature solder that can be applied locally as an alternative to the use of epoxy. Another arrangement for connection of the decal bumps to the LTCC pads is a non-conductive adhesive. Under pressure it can hold a metal to metal connection to form a conductive bond even though the adhesive itself is non-conductive. Thermosonic bond is still another alternative as a means of forming electrical connections between decal and substrate. In all of these arrangements, a horizontal pattern of connection of the decal conductors to provide a conductive transition from the fine 0.004 inch pitch of the integrated circuit chip to the coarse 0.016 inch pitch of the LTCC pad is employed. It will be readily appreciated that the horizontal patterns illustrated in the several drawings are merely exemplary of many others that may be employed embodiments of the present invention.

What is claimed is:

1. A method of making a multichip integrated circuit assembly comprising the steps of:
    forming a multilayer low temperature co-fired ceramic module having a plurality of LTCC pads,
    forming an interconnect decal having a pattern of conductive traces each connected to a primary interconnect decal pad and a secondary interconnect decal pad, wherein said secondary interconnect decal pad protrudes from the plane of said conductive traces,
    providing a plurality of integrated circuit chips, each bearing a plurality of chip pads,
    connecting said chip pads to selected ones of said primary decal pads,
    connecting said secondary decal pads to said LTCC pads, and
    connecting said chips and decal to said substrate.

2. The method of claim 1 wherein said step of forming a decal comprises forming the decal independently of said module.

3. The method of claim 1 wherein said step of forming a decal comprises forming said decal on a mandrel and removing said decal from said mandrel before connecting said secondary decal pads to said LTCC pads.

4. The method of claim 1 wherein said step of forming a decal comprises forming said conductive traces with a fine pitch that is smaller than the pitch of said LTCC pads.

5. The method of claim 1 including the steps of forming a second interconnect decal having a pattern of conductive traces each connected to a second decal primary decal pad and a second decal secondary decal pad, said step of connecting said secondary decal pads of said first mentioned decal comprising connecting said first mentioned decal secondary pads to selected second decal primary pads and connecting said second decal secondary decal pads to said LTCC pads.

6. The method of claim 1 wherein said step of forming an interconnect decal comprises forming a conductive mandrel having a depression therein, electroforming a pattern of conductors on said mandrel such that at least one conductor is electroformed in part into said depression, wherein the step of electroforming comprises integrally forming on said at least one of said conductors a bump portion displaced from the plane of said conductors in said mandrel depression, laminating a dielectric substrate to said pattern of conductors, and removing said dielectric substrate and said pattern of conductors from said mandrel whereby said bump portion forms said protruding secondary decal pad and a second portion of each said conductor forms said primary decal pad.

7. A multichip module comprising:
    a multilayer interconnection module having a plurality of module pads thereon, said module pads being spaced from one another by a first distance,
    an integrated circuit chip configured and arranged to be connected to the module and having a plurality of chip pads spaced from one another by a second distance that is smaller than said first distance, and
    an independently formed interconnection circuit including a plurality of conductors, said circuit being located on said module in proximity to said chip such that each conductor has a first connection to a pad on said chip and a second connection to a pad on said module, wherein said interconnection circuit comprises a decal having a substrate and electrical conductors formed on a side of said substrate adjacent said module, each of said conductors having a primary decal pad that is exposed for said first connection to said chip through a via in said substrate and a secondary decal pad, at least some of said secondary decal pads comprising bumps protruding from said conductors into contact with said interconnection module pads.

8. The multichip module of claim 7 wherein said interconnection module comprises a plurality of low temperature co-fired ceramic layers, and wherein said interconnection circuit comprises a mandrel-formed pattern of electrical conductors and a dielectric substrate.

9. The multichip module of claim 8 wherein said interconnection circuit comprises a thin flexible assembly of circuit layer and substrate adhesively bonded to said interconnection module.

10. The multichip module of claim 7 including a plurality of interconnecting wires bonded to said chip pad and to said primary decal pads.

11. The multichip module of claim 7 wherein each said primary decal pad comprises a bump projecting outwardly of said conductor and positioned in electrical and physical contact with said chip pads.

12. The multichip module of claim 7 wherein each said chip pad is in direct electrical contact with one of said primary decal pad of said interconnection circuit.

13. The multichip module of claim 12 wherein said interconnection circuit is positioned between said chip and said interconnection module, and wherein said secondary decal pads comprise bumps protruding from said conductors and positioned directly between said chip and said interconnection module.

14. The multichip module of claim 7 including a second interconnection circuit disposed between said first mentioned interconnection circuit and said interconnection module, said second interconnection circuit including a plurality of conductors having second circuit primary decal pads in contact with said secondary decal pads of said first mentioned interconnection circuit, said second interconnection circuit having secondary decal pads in contact with said module pads.

15. The multichip module of claim 14 wherein said secondary decal pads of said second interconnection circuit are positioned closer to said chip in a plane parallel to said chip then said secondary decal pads of said first mentioned interconnection circuit.

16. The multichip module of claim 7 wherein said secondary decal pads are positioned directly between said chip and said interconnection module.

17. The multichip module of claim 7 including an electrically conductive adhesive electrically interconnecting each of said secondary decal pads with said module pads.

18. The multichip module of claim 7 including electrically conductive material directly interconnecting each said chip pad with a respective one of said primary decal pads of the interconnecting circuit and including electrically conductive material interconnecting said module pads with respective ones of said secondary decal pads.

19. The multichip module of claim 7 wherein said multilayer interconnection module comprises a plurality of low temperature co-fired ceramic layers having LTCC pads on an uppermost surface thereof that are spaced from one another by a first distance, said integrated circuit chip having connecting pads thereon that are spaced from one another by a second distance that is smaller than said first distance.

20. An integrated circuit chip assembly for flip chip mounting comprising:
a integrated circuit chip having a plurality of contact pads, and
a decal having a dielectric substrate and a pattern of conductors formed on the substrate adjacent to said chip, each said conductor having primary and secondary end portions, each said primary end portion having a primary decal pad thereon in electrical contact with a respective one of said chip pads, each said secondary end portion having a secondary decal pad, at least some of said secondary decal pads protruding from the plane of said each conductor away from said chip and being exposed through a via in said dielectric substrate for secondary interconnection, at least some of said secondary decal pads being positioned within the perimeter of said integrated circuit chip.

21. The chip assembly of claim 20 including a chip interconnection substrate having a plurality of substrate pads thereon, each of said substrate pads being electrically connected to a respective one of said secondary decal pads of said interconnection circuit.

22. A multichip module comprising:
a substrate having a plurality of substrate pads thereon,
a plurality of integrated circuit chips mounted on the substrate and each having a plurality of chip contact pads, and
decal means for interconnecting said chip pads with said substrate pads, said decal means comprising a first decal layer including a decal substrate and a plurality of first conductors thereon, means for connecting said chip pads to said first decal layer, and a second decal layer including a second decal substrate and a plurality of second conductors thereon, said second conductors being interconnected between respective ones of said first conductors and said substrate pads, wherein some of said first conductors and some of said second conductors comprise protruding interconnecting pads that are displaced from the plane of said conductors, said protruding interconnecting pads for interconnecting between said respective ones of said first conductors, second conductors and said substrate pads.

23. The multichip module of claim 22 wherein said chip pads have a relatively fine pitch and wherein said multilayer substrate comprises a multilayer low temperature co-fired ceramic module having a plurality of LTCC pads thereon with a pitch that is several times greater than the pitch of said chip pads.

* * * * *